US012720717B2

(12) United States Patent
Miyoshi et al.

(10) Patent No.: US 12,720,717 B2
(45) Date of Patent: Aug. 25, 2026

(54) VEHICLE DISPLAY DEVICE

(71) Applicant: YAZAKI CORPORATION, Tokyo (JP)

(72) Inventors: Yuki Miyoshi, Makinohara (JP); Yasuhiro Katsumata, Makinohara (JP); Naoto Tsubakihara, Makinohara (JP); Hiroshi Sano, Makinohara (JP); Takahiro Osawa, Shimada (JP)

(73) Assignee: YAZAKI CORPORATION, Tokyo (JP)

( * ) Notice: Subject to any disclaimer, the term of this patent is extended or adjusted under 35 U.S.C. 154(b) by 246 days.

(21) Appl. No.: 18/792,268

(22) Filed: Aug. 1, 2024

(65) Prior Publication Data

US 2025/0071958 A1 Feb. 27, 2025

(30) Foreign Application Priority Data

Aug. 24, 2023 (JP) ................................ 2023-136111

(51) Int. Cl.
*H05K 7/20* (2006.01)
*B60K 35/22* (2024.01)

(52) U.S. Cl.
CPC ......... *H05K 7/20963* (2013.01); *B60K 35/22* (2024.01); *H05K 7/20981* (2013.01); *B60K 2360/691* (2024.01)

(58) Field of Classification Search
CPC .. B60K 35/22; B60K 35/23; B60K 2360/691; B60K 35/231; G02B 27/01; H05K 7/20963; H05K 7/2039; H05K 7/20409; H05K 7/20954
See application file for complete search history.

(56) References Cited

U.S. PATENT DOCUMENTS 10,473,966 B2 * 11/2019 Yuuki .................. B60K 35/213
11,226,488 B2 * 1/2022 Saito ...................... B60K 35/22
12,259,549 B2 * 3/2025 Horiuchi ................ B60K 35/22
2019/0129172 A1 * 5/2019 Misawa ................. B60K 35/23
2020/0379256 A1 12/2020 Saito et al.

FOREIGN PATENT DOCUMENTS

JP 2019-166852 A 10/2019
WO 2019/181927 A1 9/2019

* cited by examiner

*Primary Examiner* — Mandeep S Buttar
(74) *Attorney, Agent, or Firm* — KENEALY VAIDYA LLP

(57) ABSTRACT

A vehicle display device includes a housing mounted on a vehicle, an image display device provided in a housing section of the housing, and a heat sink provided at a position to contact the image display device, in which the housing has an opening that is open upward, the heat sink is attached at a position to separate the housing section and the opening from each other in the housing, and has a heat dissipation surface exposed from the housing through the opening, and a discharging flow path for discharging a liquid that has entered the opening to the outside of the housing is formed on the heat dissipation surface.

6 Claims, 8 Drawing Sheets

FIG.2

100
13
12c
12
11
30a
30
31
12b
FP (FPb, 30a)
12a
12b
FP (FPb, 30a)

VEHICLE DISPLAY DEVICE

CROSS-REFERENCE TO RELATED APPLICATION(S)

The present application claims priority to and incorporates by reference the entire contents of Japanese Patent Application No. 2023-136111 filed in Japan on Aug. 24, 2023.

BACKGROUND OF THE INVENTION

1. Field of the Invention

The present invention relates to a vehicle display device.

2. Description of the Related Art

Japanese Patent Application Laid-open No. 2019-166852 discloses a head-up display including a backlight unit, a first case having two fixing portions to which a lens holder is fixed, and a second case fitted to the first case. Japanese Patent Application Laid-open No. 2019-166852 discloses that the backlight unit includes a substrate on which a light source is mounted in such a manner that light is emitted to a display panel from a back surface thereof, a lens which condenses a light beam from the light source, a lens holder which accommodates the lens and the substrate, and a heat sink to which the lens holder is fixed and which dissipates heat transmitted from the substrate. The first case of the head-up display has a protective wall surrounding the heat sink, and a drain hole for draining moisture that tries to enter the inside of the first case from the protective wall is provided in the protective wall on the bottom side.

Concerning a vehicle display device, there is still room for improvement in order to achieve both a function of discharging a liquid that has entered a heat discharging opening of a housing to the outside of the housing and a heat discharging function of a heat sink.

SUMMARY OF THE INVENTION

An object of the present invention is to provide a vehicle display device capable of efficiently achieving both a function of discharging a liquid that has entered a heat discharging opening of a housing to the outside of the housing and a heat discharging function of a heat sink.

In order to achieve the above mentioned object, a vehicle display device according to one aspect of the present invention includes a housing mounted on a vehicle; an image display device provided in a housing section of the housing; and a heat sink provided at a position to contact the image display device, wherein the housing has an opening that is open upward in a state where the housing is mounted on the vehicle, the heat sink is attached at a position to separate the housing section and the opening from each other in the housing, and has a heat dissipation surface exposed from the housing through the opening, and a discharging flow path for discharging a liquid that has entered the opening to an outside of the housing is formed on the heat dissipation surface.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 2 is a schematic configuration diagram illustrating the vehicle display device according to the embodiment;

DETAILED DESCRIPTION OF THE PREFERRED EMBODIMENTS

Hereinafter, a vehicle display device according to an embodiment of the present invention will be described in detail with reference to the drawings. Note that the present invention is not limited by the present embodiment. In addition, the components in the following embodiment include those that can be easily imagined by those skilled in the art or those that are substantially the same.

Embodiment

Figure 1:
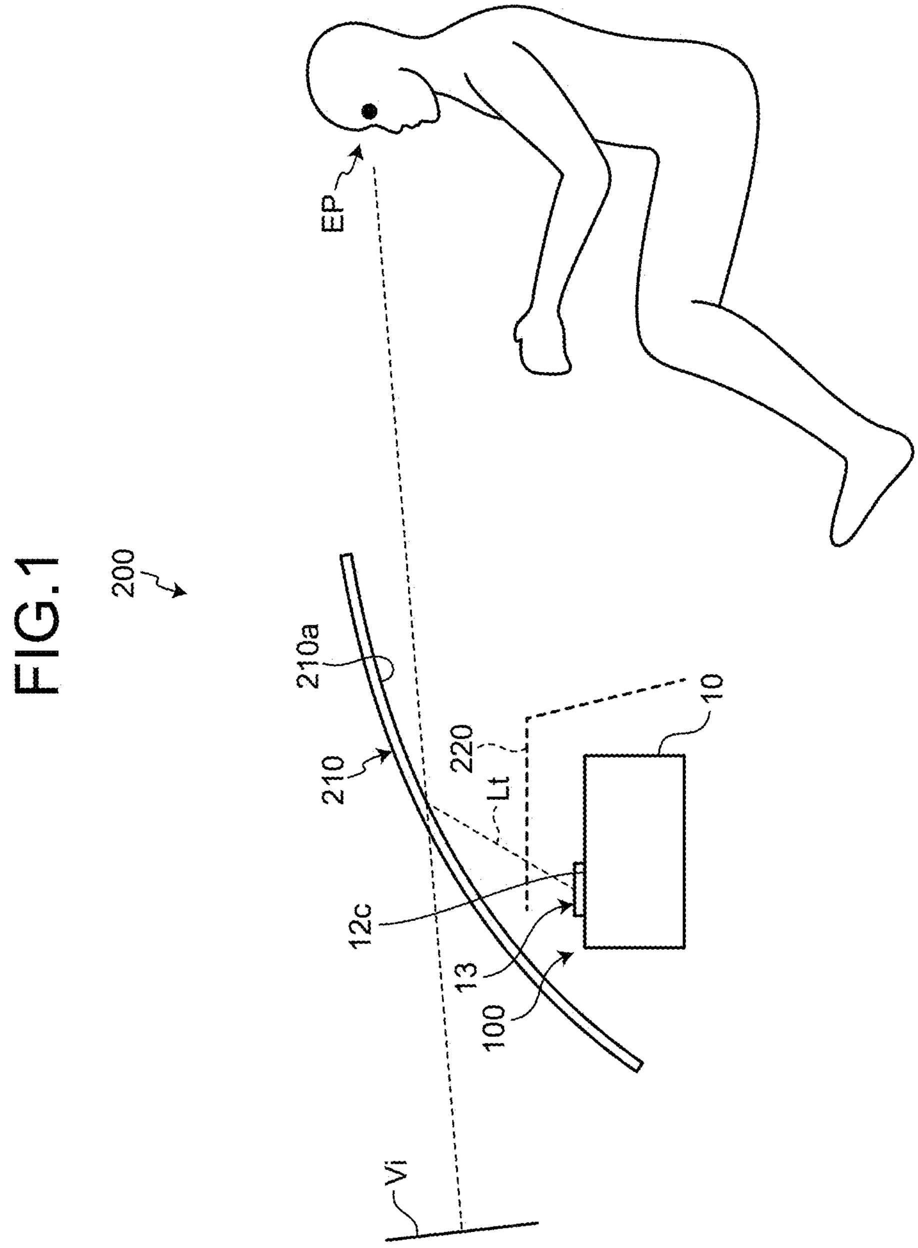
FIG. 1 is a view illustrating a vehicle on which a vehicle display device according to an embodiment is mounted.
Figure 3:
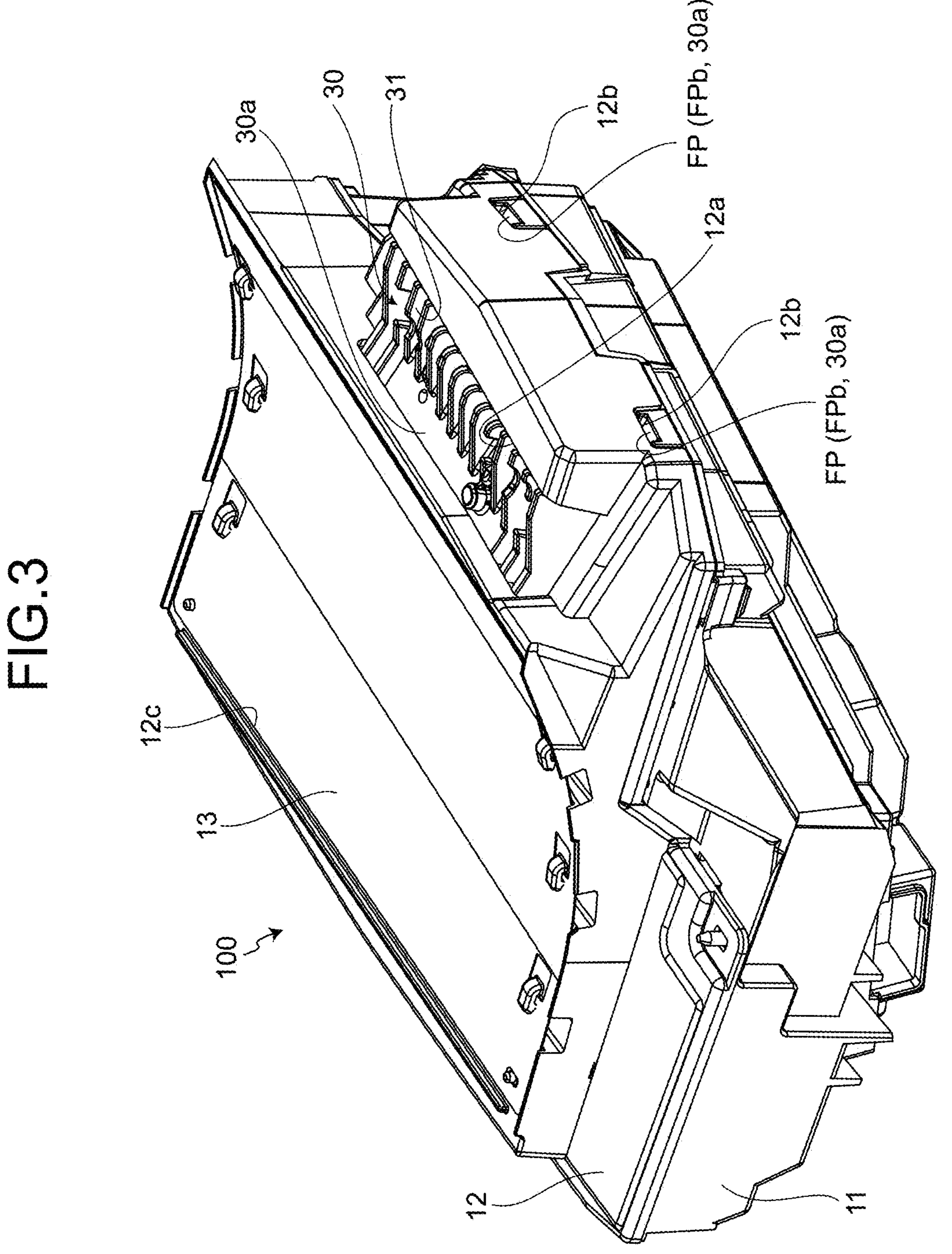
FIG. 3 is a perspective view illustrating the vehicle display device according to the embodiment.
Figure 4:
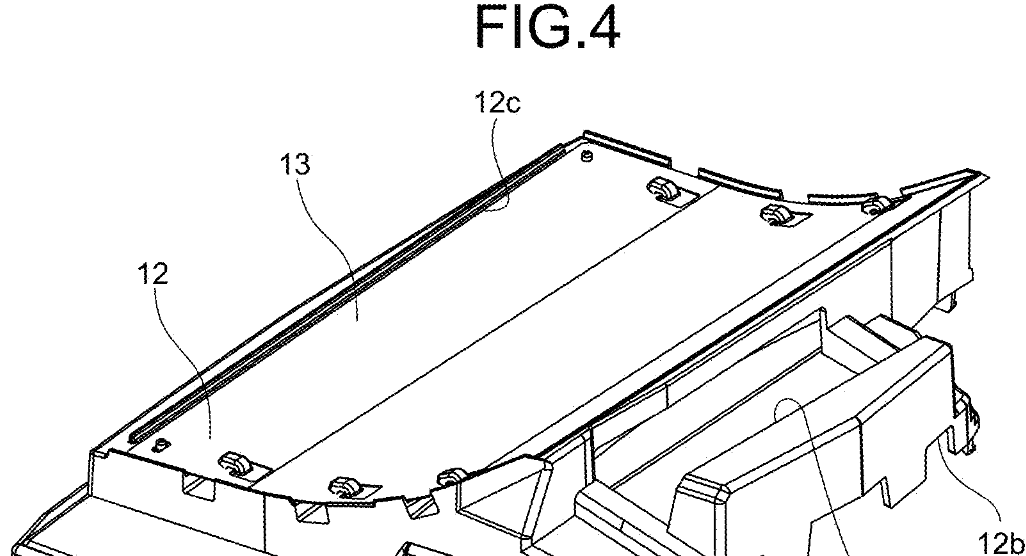
FIG. 4 is an exploded perspective view illustrating the vehicle display device according to the embodiment.
Figure 4:
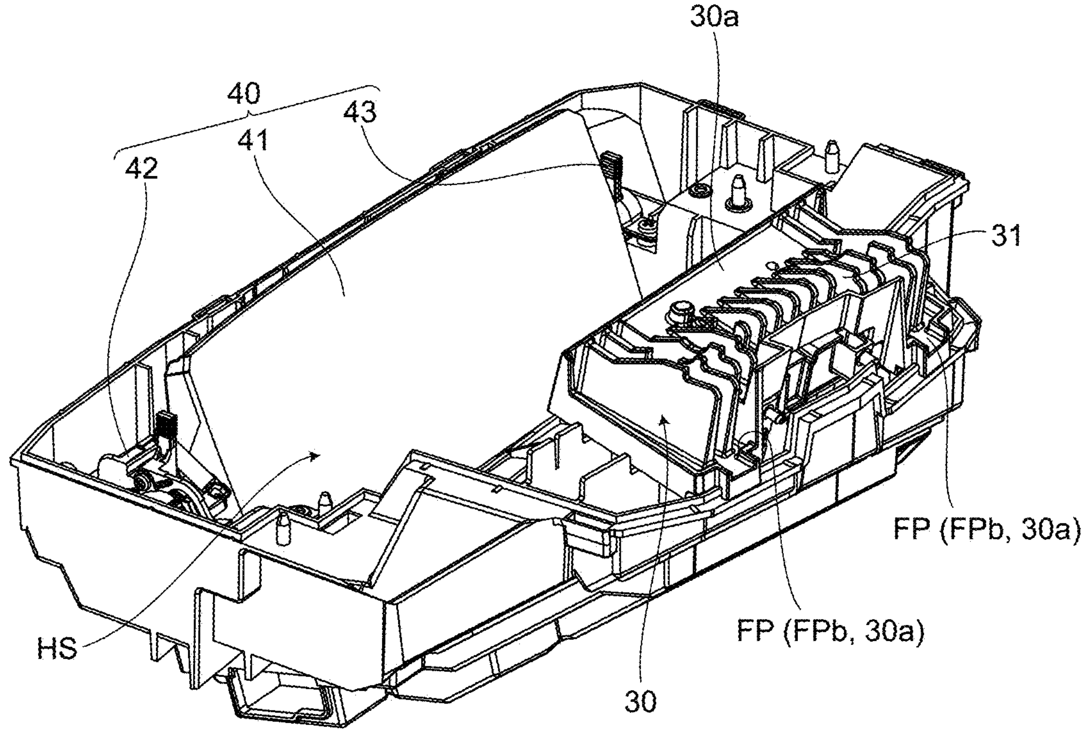
Figure 5:
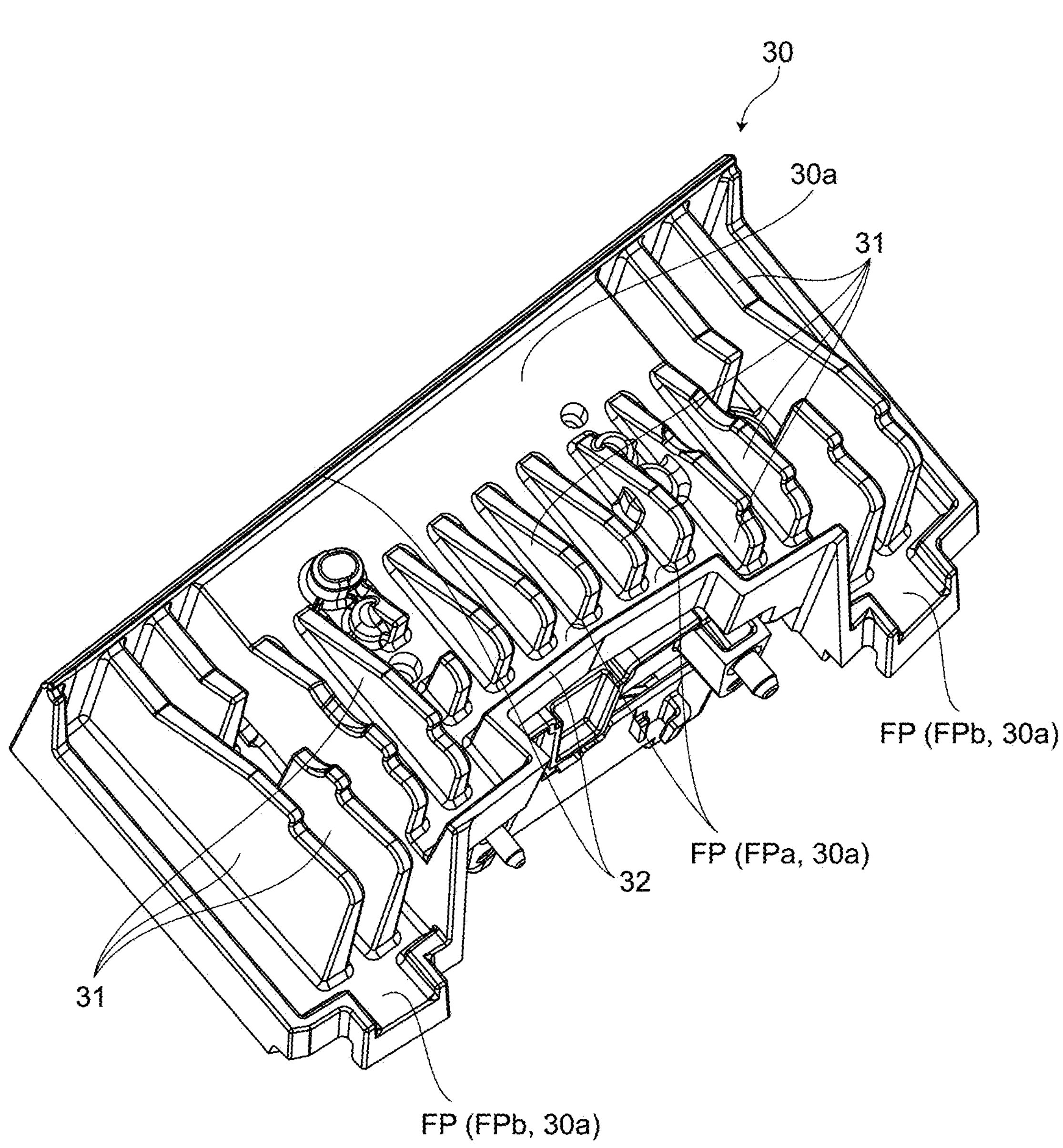
FIG. 5 is a perspective view illustrating a heat sink and an image display device according to the embodiment.
Figure 6:
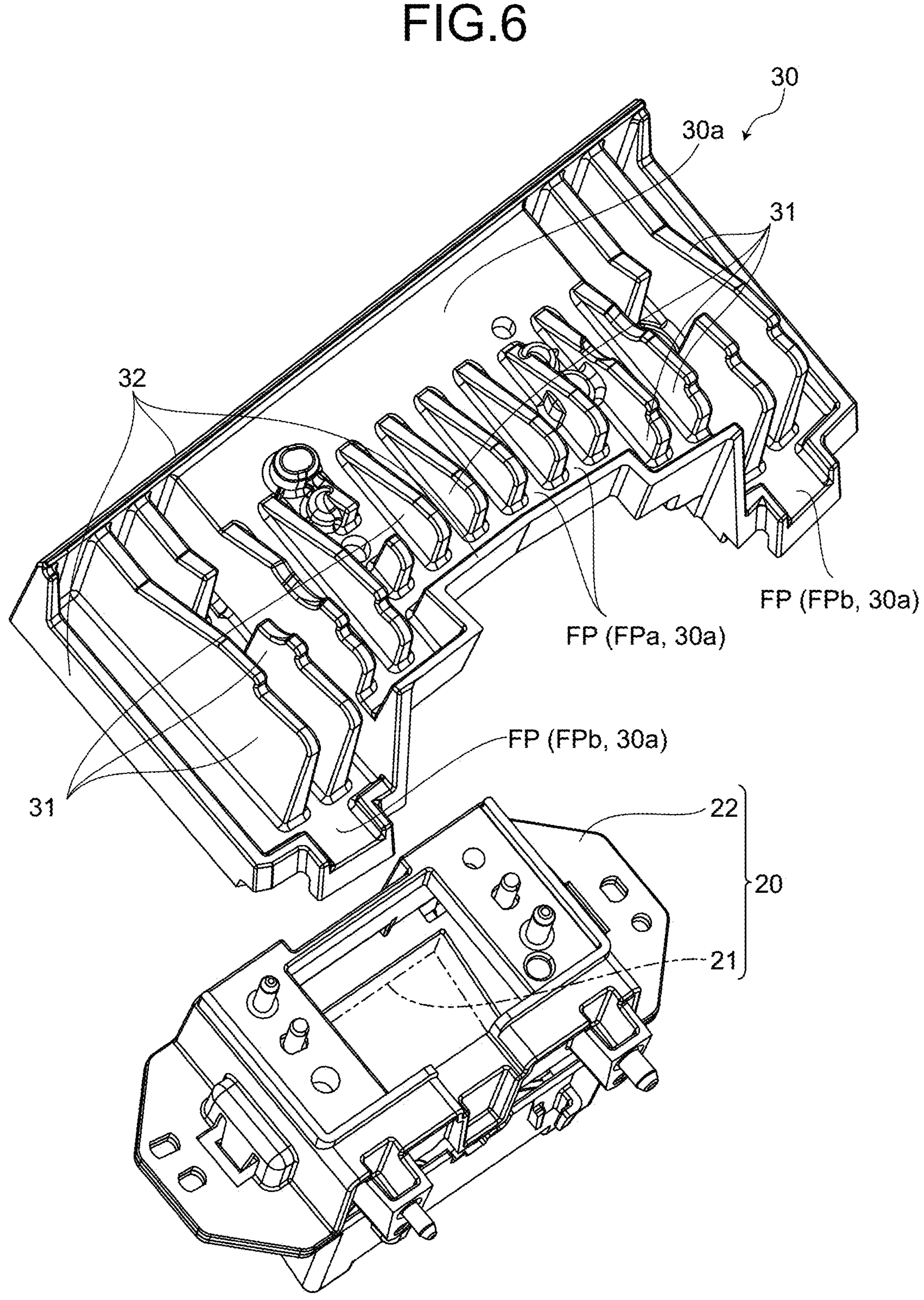
FIG. 6 is an exploded perspective view illustrating the heat sink and the image display device according to the embodiment.
Figure 7:
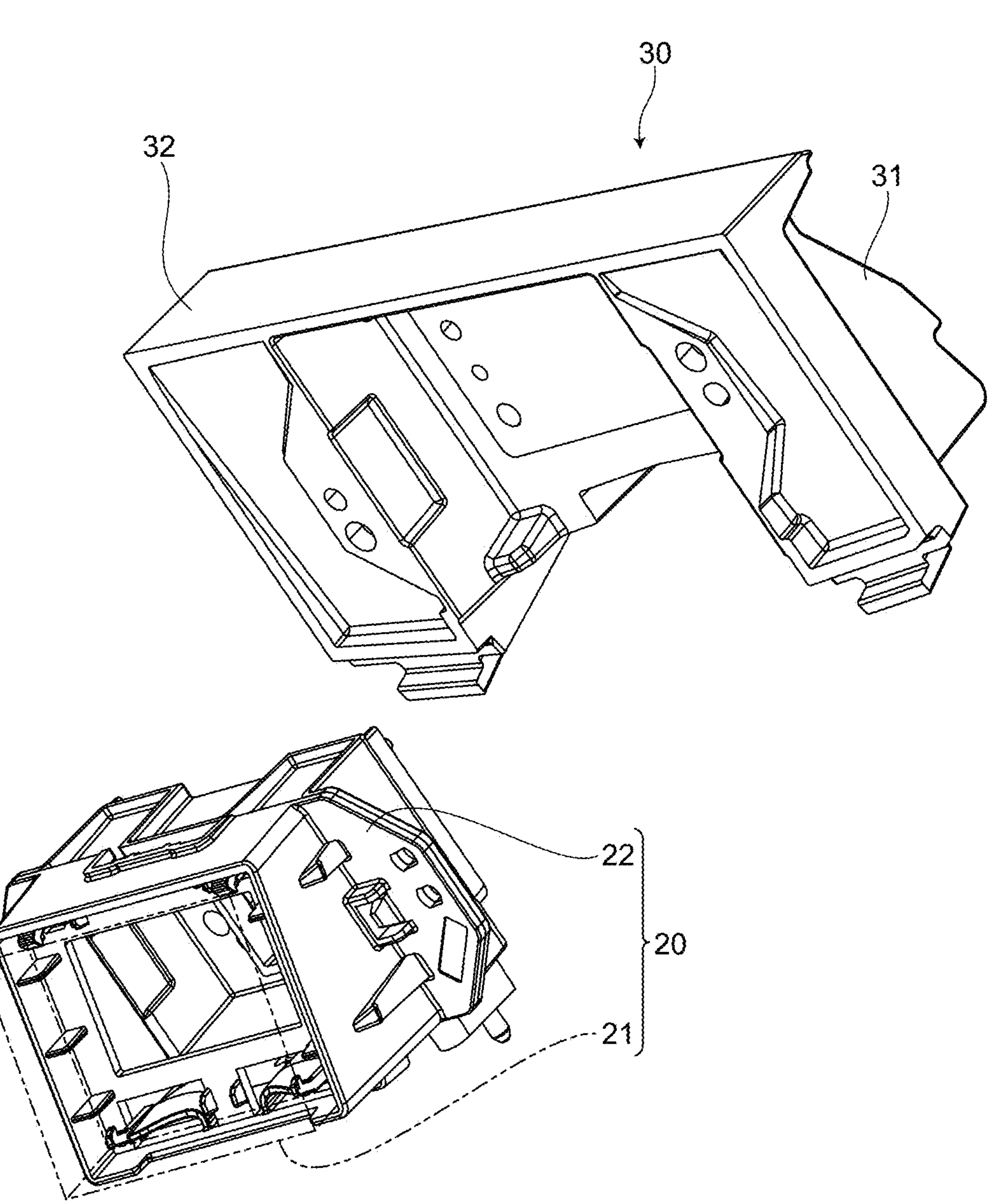
FIG. 7 is an exploded perspective view illustrating the heat sink and the image display device according to the embodiment.
Figure 8:
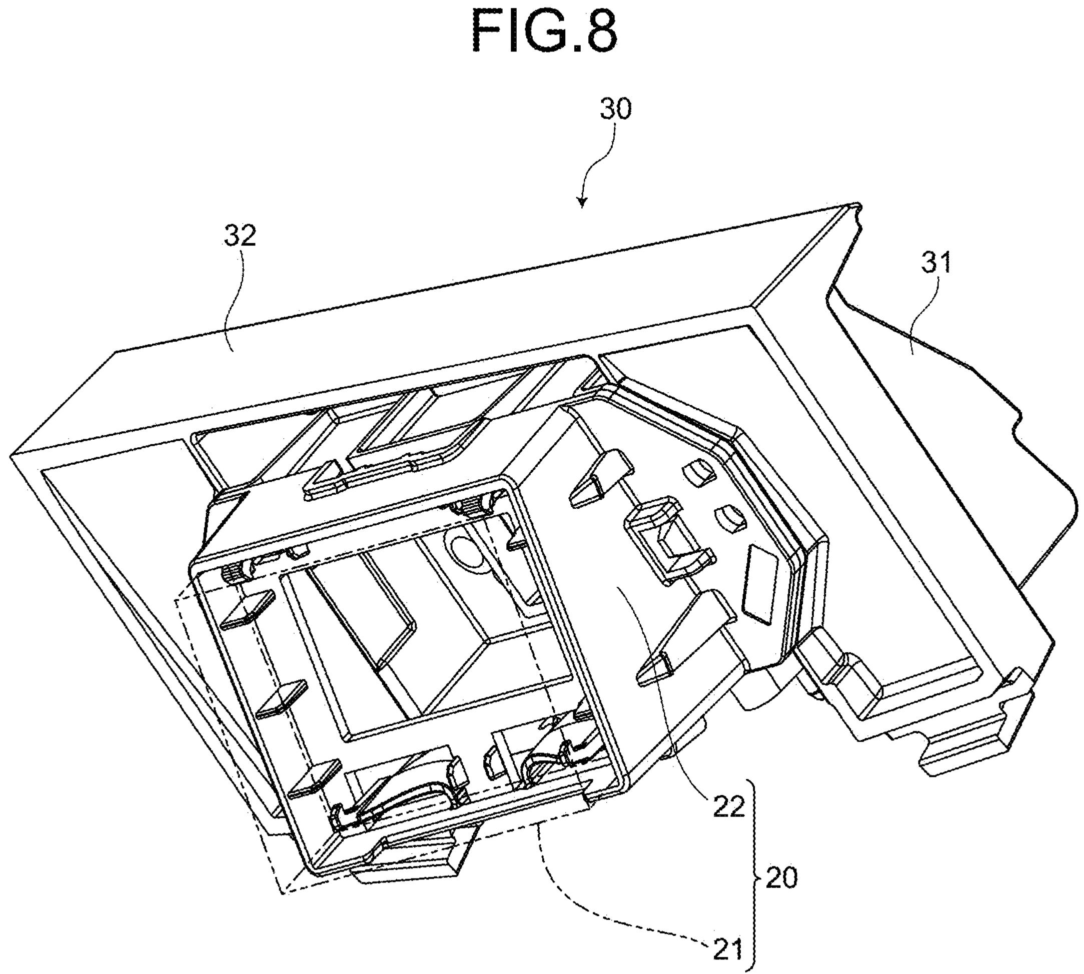
FIG. 8 is a perspective view illustrating the heat sink and the image display device according to the embodiment.

An embodiment will be described with reference to FIGS. 1 to 8. The present embodiment relates to a vehicle display device. FIG. 1 is a view illustrating a vehicle on which a vehicle display device according to an embodiment is mounted, FIG. 2 is a schematic configuration diagram illustrating the vehicle display device according to the embodiment, FIG. 3 is a perspective view illustrating the vehicle display device according to the embodiment, FIG. 4 is an exploded perspective view illustrating the vehicle display device according to the embodiment, FIG. 5 is a perspective view illustrating a heat sink and an image display device according to the embodiment, FIG. 6 is an exploded perspective view illustrating the heat sink and the image display device according to the embodiment, FIG. 7 is an exploded perspective view illustrating the heat sink and the image display device according to the embodiment, and FIG. 8 is a perspective view illustrating the heat sink and the image display device according to the embodiment.

A vehicle display device 100 according to an embodiment illustrated in FIG. 1 is a head-up display device mounted on a vehicle 200 such as an automobile. The vehicle display device 100 is housed in an instrument panel 220 of the vehicle 200. The vehicle display device 100 projects image display light Lt toward a reflecting surface 210*a* of a windshield 210 of the vehicle 200 through an opening of the instrument panel 220. The windshield 210 is a reflecting portion located in front of an eye point EP in the vehicle 200, and has, for example, semi-transmissivity and reflects the display light Lt incident on the reflecting surface 210*a* from the vehicle display device 100 toward the eye point EP. A driver of the vehicle 200 can visually recognize a virtual image Vi through the display light Lt reflected by the windshield 210.

Figure 2:
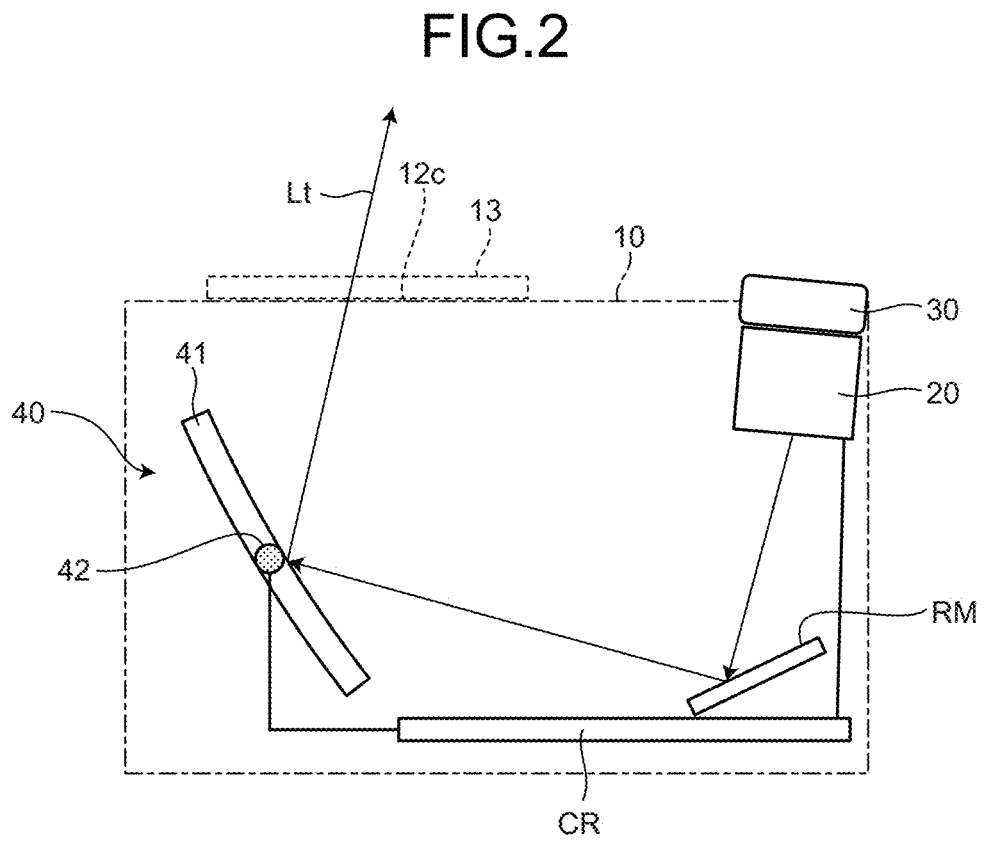

As illustrated in FIG. 2, the vehicle display device 100 includes a housing 10, an image display device 20, a heat sink 30, a mirror device 40, a reflection member RM, and a controller CR. The housing 10 is formed in a box shape, and is mounted on the vehicle 200. The housing 10 houses the image display device 20, the mirror device 40, the reflection member RM, and the controller CR in a housing section HS (see FIG. 4) inside the housing 10. The heat sink 30 is attached to the image display device 20. The image display device 20, the heat sink 30, the mirror device 40, the reflection member RM, and the controller CR are fixed to the housing 10.

The housing 10 has an opening 12*c* (see FIG. 3) through which the display light Lt is emitted from the inside of the housing 10 toward the reflecting surface 210*a* of the windshield 210, and a cover member 13 that closes the opening 12*c* is attached to the housing 10. The cover member 13 is a light transmissive member that transmits at least the display light Lt emitted from the image display device 20.

As illustrated in FIGS. 3 and 4, the housing 10 according to the embodiment includes a lower case 11 and an upper case 12. The lower case 11 and the upper case 12 are formed of, for example, an insulating synthetic resin. The lower case 11 is a box-shaped member whose upper side is opened, and the upper case 12 is a box-shaped member whose lower side is opened. The lower case 11 and the upper case 12 constitute the housing 10 by engaging them in such a manner that an opening of the lower case 11 and an opening of the upper case 12 are aligned with each other. In the housing 10 according to the embodiment, the opening 12*c* through which the display light Lt is emitted toward the reflecting surface 210*a* of the windshield 210 is formed in a partial portion of an upper surface of the upper case 12. The image display device 20, the mirror device 40, the reflection member RM, and the controller CR are assembled and held in the lower case 11.

The image display device 20 outputs a display image to be projected onto the windshield 210 as display light Lt. The image display device 20 includes a liquid crystal display part and a backlight unit. The liquid crystal display part is a so-called liquid crystal panel, and is comprised of, for example, a light transmissive or semi-transmissive thin film transistor (TFT) liquid crystal display and the like. The liquid crystal display part is illuminated from its rear side, causing a display surface on its front side to emit light. The backlight unit illuminates the liquid crystal display part from the rear side thereof. The backlight unit is driven by, for example, electric power obtained from a battery (not illustrated) in the vehicle 200.

The heat sink 30 is disposed in contact with the image display device 20, and is a member that dissipates heat generated in the image display device 20. The heat sink 30 is formed of, for example, a member made of metal having high thermal conductivity such as aluminum. In the embodiment, the heat sink 30 is attached to a back surface of the image display device 20 (a side opposite to an emission surface to which the display light Lt is emitted), and is mainly configured to receive heat generated in the backlight unit and dissipate the heat to the outside of the housing 10.

The housing 10 has an opening 12*a* that is open upward in a state where the housing 10 is mounted on the vehicle 200. As illustrated in FIG. 3, the opening 12*a* is provided in a partial portion different from the portion where the opening 12*c* is formed of the upper case 12. When viewed from above, the opening 12*a* according to the embodiment is formed in a substantially rectangular shape. The opening 12*a* is an opening for discharging heat from the heat sink 30 to the outside of the housing 10.

The heat sink 30 is attached to the housing 10 so as to close the opening 12*a*. The heat sink 30 has a heat dissipation surface 30*a*, and the heat dissipation surface 30*a* is exposed from the housing 10 through the opening 12*a*. As illustrated in FIGS. 2 and 4, in the vehicle display device 100, the image display device 20, the mirror device 40, the reflection member RM, and the controller CR are housed in the housing section HS of the housing 10, and the heat sink 30 is attached at a position to separate the housing section HS and the opening 12*a* from each other in the housing 10.

A discharging flow path FP for discharging a liquid that has entered the opening 12*a* to the outside of the housing 10 is formed on the heat dissipation surface 30*a* of the heat sink 30. For example, a liquid such as a drink spilled by an occupant of the vehicle 200 may enter the opening 12*a* of the image display device 20 through an opening of the instrument panel 220. The liquid that has entered the opening 12*a* flows on the discharging flow path FP, and is directly discharged to the outside of the housing from a terminal end of the discharging flow path FP.

As illustrated in FIGS. 5 and 6, the heat sink 30 has a plurality of protrusions 31 protruding from the heat dissipation surface 30*a*, and the discharging flow path FP is formed as a groove-shaped portion between adjacent protrusions 31 on the heat dissipation surface 30*a*. The protrusions 31 according to the embodiment function as heat dissipation fins. That is, the protrusions 31 function to increase the surface area of the heat sink 30, thereby enhancing the heat dissipation effect of the heat sink 30.

The heat sink 30 according to the embodiment has a side wall 32 erected along the outer periphery of the heat dissipation surface 30*a*, and the protrusions 31 are disposed inside a region surrounded by the side wall 32 on the heat dissipation surface 30*a*. Here, a groove-shaped discharging flow path FP is also formed between the side wall 32 and the protrusion 31 disposed at a position adjacent to the side wall 32. Since the side wall 32 of the heat sink 30 separates the heat dissipation surface 30*a* and the housing 10 from each other, it is possible to suppress a leakage of a liquid splashed onto the heat dissipation surface 30*a* of the heat sink 30 into the housing 10. For example, the side wall 32 of the heat sink 30 can suppress the liquid splashed onto the heat dissipation surface 30*a* of the heat sink 30 from entering the housing section HS from between the heat dissipation surface 30*a* and the housing 10.

In the heat sink 30 according to the embodiment, a partial portion of the side wall 32 is cut out, and this cut-out portion is a terminal end of the discharging flow path FP. The terminal end of the discharging flow path FP is a portion for discharging the liquid that has entered the opening 12*a* from the inside of the opening 12*a* to the outside of the housing 10. In a state where the heat sink 30 is attached to the housing 10, the discharging flow path FP is formed in such a manner that the liquid splashed onto the heat dissipation surface 30*a* flows toward the terminal end of the discharging flow path FP, and the terminal end of the discharging flow path FP is disposed at a position where the liquid that has entered the opening 12*a* is discharged to the outside of the housing 10.

As illustrated in FIGS. 3 and 4, the housing 10 has a discharge port 12*b* that is an outlet for liquid that has entered the opening 12*a*. In the embodiment, a cut-out portion is formed in a partial portion of an edge of a side wall of the upper case 12, and the discharge port 12*b* is formed by the cut-out portion and an edge of a side wall of the lower case 11. In the heat sink 30 according to the embodiment, two terminal ends of the discharging flow path FP are formed, and the discharge port 12*b* is formed at a position corresponding to each of the terminal ends of the discharging flow path FP on a side wall of the housing 10. That is, the terminal end of the discharging flow path FP and the discharge port 12*b* are provided on a one-to-one basis.

As illustrated in FIGS. 5 and 6, the discharging flow path FP of the heat sink 30 includes a rectification region FPa that is a region between adjacent protrusions 31, and a terminal end region FPb that is a region disposed in the discharge port 12*b* and including a terminal end of the discharging flow path FP. The rectification region FPa according to the embodiment also includes a region between the side wall 32 and the protrusion 31 disposed at a position adjacent to the side wall 32. The rectification region FPa is a region for guiding the liquid splashed onto the heat dissipation surface 30*a* to the terminal end region FPb. The rectification region FPa is exposed from the opening 12*a* of the housing 10. The liquid that has entered the opening 12*a* is splashed onto the rectification region FPa and flows through the discharging flow path FP in the rectification region FPa to be guided to the terminal end region FPb. The terminal end region FPb is a region for discharging the liquid that has entered the opening 12*a* to the outside of the opening 12*a* (the outside of the housing 10). The terminal end region FPb is provided in a partial portion of an outer peripheral portion of the heat sink 30, and is formed to protrude from the rectification region FPa.

In the embodiment, the terminal end region FPb which is a region including a terminal end of the discharging flow path FP is disposed in the discharge port 12*b* of the housing 10. The terminal end of the discharging flow path FP is exposed from the discharge port 12*b*, and the liquid that has entered the opening 12*a* is directly discharged from the terminal end of the discharging flow path FP to the outside of the opening 12*a* (the outside of the housing 10) via the rectification region FPa. That is, in the vehicle display device 100 according to the embodiment, the terminal end region FPb is formed in such a manner that the liquid flowing along the discharging flow path FP (the terminal end region FPb) does not come into contact with the housing 10. With this configuration, it is possible to suppress the liquid from entering the housing section HS from between the housing 10 and the heat sink 30.

In addition, in a state where the housing 10 is mounted on the vehicle 200, the heat sink 30 is attached to the housing 10 in a state where the heat dissipation surface 30*a* is inclined in such a manner that the terminal end of the discharging flow path FP faces downward. That is, in a state where the housing 10 is mounted on the vehicle 200, the heat dissipation surface 30*a* is inclined in such a manner that the terminal end of the discharging flow path FP faces downward with respect to a horizontal plane orthogonal to the vertical direction of the vehicle 200. The inclined angle of the heat dissipation surface 30*a* with respect to the horizontal plane orthogonal to the vertical direction of the vehicle 200 is appropriately set to an inclined angle at which the liquid having entered the opening 12*a* smoothly flows from the rectification region FPa toward the terminal end region FPb. In addition, in order to utilize the liquid on the heat dissipation surface 30*a* to cool the heat sink 30, the inclined angle of the heat dissipation surface 30*a* may be set to an angle at which the time for the liquid to stay on the heat dissipation surface 30*a* can be ensured to some extent.

In the embodiment, each protrusion 31 is formed in a plate shape extending along the direction in which the heat dissipation surface 30*a* is inclined. In the direction along which each protrusion 31 extends, an end of each protrusion 31 on the terminal end region FPb side (a lower end of each protrusion 31 in the direction in which the heat dissipation surface 30*a* is inclined) is separated from the side wall 32 of the heat sink 30. The liquid flowing between adjacent protrusions 31 joins together after passing between the ends of the protrusions 31 on the terminal end region FPb side and the side wall 32, and reaches the terminal end region FPb (the terminal end of the discharging flow path FP).

As illustrated in FIGS. 6 and 7, the heat sink 30 is attached to the image display device 20 with a surface (an attachment surface) opposite to the heat dissipation surface 30*a* being in contact with the image display device 20. In the embodiment, the image display device 20 includes a main body 21 including a liquid crystal display part and a light source of a backlight unit, and a case 22 housing the main body 21. In the image display device 20 according to the embodiment, the case 22 is a box-shaped member having an opening on one surface, and houses the liquid crystal display part and the light source of the backlight unit in such a manner that the display surface of the liquid crystal display part is exposed from the opening. The light source is housed in the case 22 to constitute the backlight unit. The light source of the backlight unit is disposed at a position facing the rear surface opposite to the display surface of the liquid crystal display part in the case 22.

As illustrated in FIG. 8, the heat sink 30 is attached to a rear portion of the case 22 (a portion of the case 22 on a side opposite to a portion where the display surface of the liquid crystal display part is exposed). The heat sink 30 is fixed to the case 22 by a fixing member such as a screw. The case 22 is formed of, for example, a resin material. Note that the case 22 may be formed of a metal material having high thermal conductivity such as aluminum. In this case, heat generated from the light source of the backlight unit and the like can be efficiently transferred to the heat sink 30.

As described above, the reflection member RM is provided in the vehicle display device 100 according to the embodiment. As illustrated in FIG. 2, the reflection member RM is a flat mirror, and the reflecting surface that reflects the display light Lt is formed as a flat surface. The reflection member RM is disposed at a position facing the image display device 20. The reflection member RM reflects the display light Lt emitted from the image display device 20 toward a mirror 41 of the mirror device 40.

The mirror device 40 includes a mirror 41, a drive member 42, and a bearing member 43. The mirror 41 reflects the display light Lt reflected by reflection member RM toward the reflecting surface 210*a* of the windshield 210 through the opening 12*c*. The mirror 41 according to the embodiment is a concave mirror and has a function as a magnifying mirror. That is, the mirror 41 according to the embodiment magnifies the display image and reflects the magnified display image in such a manner that the display image represented by the display light Lt after being reflected by the concave mirror 41 becomes relatively larger than the display image represented by the display light Lt before being reflected by the mirror 41.

The mirror 41 includes a main body and a pair of rotation shafts protruding from respective side walls of the main body. The main body includes a reflecting surface that reflects the display light Lt. In the embodiment, the main body is a substantially rectangular flat plate-like member whose longitudinal direction is a direction following a rotation axis of the mirror when viewed from the thickness direction of the main body.

The rotation shafts of the mirror are disposed at a position of the rotation axis. The rotation axis is the center of rotation of the mirror 41. A central axis of each of the rotation shafts of the mirror is on the rotation axis. In the embodiment, the rotation shafts of the mirror protrude along the rotation axis from the respective side walls in the width direction of the main body, the drive member 42 is attached to one of the rotation shafts, and the bearing member 43 is attached to the other rotation shaft. The drive member 42 and the bearing member 43 are fixed to the lower case 11 by fixing members such as screws, and the mirror 41 is attached to the lower case 11 via the drive member 42 and the bearing member 43.

The drive member 42 includes a motor and a power transmission member. The motor rotates an output shaft of the motor by electric power supplied from a battery or the like of the vehicle 200. The power transmission member is a member that transmits a driving force from the output shaft of the motor to the rotation shaft of the mirror. The power transmission member is comprised of, for example, a gear and the like. When the rotation of the output shaft of the motor is transmitted to the rotation shaft of the mirror 41 by the power transmission member, the main body of the mirror 41 rotates. With this configuration, the angle of the main body of the mirror 41 can be changed.

The controller CR controls the image display device 20 to perform display control with respect to a display image (a virtual image) to be displayed by the vehicle display device 100. The controller CR is also connected to the mirror device 40, and can adjust the angle of the main body of the mirror 41 by controlling the rotation of the motor of the mirror device 40. That is, the controller CR can control the mirror device 40 to adjust the display position of the display image.

As described above, the vehicle display device 100 according to the embodiment includes the housing 10 mounted on the vehicle 200, the image display device 20 provided in the housing section HS of the housing 10, and the heat sink 30 provided at a position to contact the image display device 20, in which the housing 10 has the opening 12*a* that is open upward in a state where the housing 10 is mounted on the vehicle 200, the heat sink 30 is attached at a position to separate the housing section HS and the opening 12*a* from each other in the housing 10, and has the heat dissipation surface 30*a* exposed from the housing 10 through the opening 12*a*, and the discharging flow path FP for discharging a liquid that has entered the opening 12*a* to the outside of the housing 10 is formed on the heat dissipation surface 30*a*.

In the vehicle display device 100 according to the embodiment, by forming the discharging flow path FP for discharging the liquid that has entered through the opening 12*a* to the outside of the housing 10 on the heat sink 30, it is possible to efficiently achieve both the function of discharging the liquid that has entered the heat discharging opening 12*a* of the housing 10 to the outside of the housing 10 and the heat discharging function of the heat sink 30. In addition, since the liquid that has entered through the opening 12*a* and has been splashed onto the heat sink 30 can be directly discharged to the outside of the housing 10, it is possible to suppress the liquid from entering the housing section HS from between the heat sink 30 and the housing 10. In addition, for example, by providing the discharging flow path FP on the heat dissipation surface 30*a* of the heat sink 30, the liquid on the heat dissipation surface 30*a* can be guided to the outside of the housing 10 while being used for cooling the heat sink 30. In addition, by forming the discharging flow path FP on the heat sink 30, the liquid that has entered from the opening 12*a* can be discharged to the outside of the housing 10 without forming a discharging flow path on the housing 10, and the size of the housing 10 can be reduced because it is not necessary to provide a discharging flow path on the housing 10.

In the vehicle display device 100 according to the embodiment, the heat sink 30 has a plurality of protrusions 31 protruding from the heat dissipation surface 30*a*, and the discharging flow path FP is formed as a groove-shaped portion between adjacent ones of the protrusions 31 on the heat dissipation surface 30*a*.

In the vehicle display device 100 according to the embodiment, since the discharging flow path FP is formed by the heat dissipation fins (the protrusions 31) of the heat sink 30, it is possible to discharge the liquid that has entered from the opening 12*a* to the outside of the housing while improving the heat dissipation efficiency of the heat sink 30.

In the vehicle display device 100 according to the embodiment, the housing 10 has the discharge port 12*b* that is an outlet for the liquid that has entered the opening 12*a*, and the discharging flow path FP includes the rectification region FPa that is a region between adjacent ones of the protrusions 31 and the terminal end region FPb that is a region disposed in the discharge port 12*b* and including a terminal end of the discharging flow path FP.

In the vehicle display device 100 according to the embodiment, by directly discharging the liquid from the terminal end of the discharging flow path FP to the outside of the housing 10 through the discharge port of the housing 10, it is possible to suppress the liquid from being splashed between the housing 10 and the heat sink 30. That is, it is possible to suppress the liquid from entering the housing section HS from between the housing 10 and the heat sink 30.

In the vehicle display device 100 according to the embodiment, in a state where the housing 10 is mounted on the vehicle 200, the heat dissipation surface 30*a* is inclined in such a manner that the terminal end of the discharging flow path FP faces downward with respect to a horizontal plane orthogonal to a vertical direction of the vehicle 200.

In the vehicle display device 100 according to the embodiment, by inclining the heat dissipation surface 30*a* of the heat sink 30 toward the discharge port of the housing 10, the time for the liquid to stay on the heat dissipation surface 30*a* is ensured to some extent, so that the heat sink 30 can be cooled by the liquid, while enabling the liquid to be smoothly discharged.

Modified Example

In the above-described embodiment, the configuration in which the image display device 20, the mirror device 40, the reflection member RM, and the controller CR are assembled in the lower case 11 has been described as an example, but the present invention is not limited to this configuration. For example, the image display device 20, the mirror device 40, the reflection member RM, and the controller CR may be assembled in the upper case 12.

Reference Example

As a reference example different from the embodiment, it may be considered to provide a lid that covers the opening 12*a* on the upper case 12 instead of forming the discharging flow path FP on the heat sink 30. However, in this case, there is a possibility that heat may be trapped in a space between the heat dissipation surface 30*a* of the heat sink 30 and the lid, which deteriorates the heat discharging function in the vehicle display device. In addition, the lid increases the size of the housing 10.

In contrast, in the vehicle display device 100 according to the embodiment, by providing the discharging flow path FP on the heat sink 30, even if the liquid has entered the opening 12*a*, the liquid can be discharged to the outside of the opening 12*a*. Therefore, the size of the housing 10 can be smaller than the configuration of the reference example in which the lid is provided on the upper case 12.

The embodiments disclosed above can be carried out in an appropriate combination.

The vehicle display device according to the present embodiment has an effect of efficiently achieving both the function of discharging a liquid that has entered the heat discharging opening of the housing to the outside of the housing and the heat discharging function of the heat sink.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A vehicle display device comprising:

a housing mounted on a vehicle;

an image display device provided in a housing section of the housing; and a heat sink provided at a position to contact the image display device, wherein the housing has an opening that is open upward in a state where the housing is mounted on the vehicle, the heat sink is attached at a position to separate the housing section and the opening from each other in the housing, and has a heat dissipation surface exposed from the housing through the opening, and a discharging flow path for discharging a liquid that has entered the opening to an outside of the housing is formed on the heat dissipation surface.

2. The vehicle display device according to claim 1, wherein the heat sink has a plurality of protrusions protruding from the heat dissipation surface, and the discharging flow path is formed as a groove-shaped portion between adjacent ones of the protrusions on the heat dissipation surface.

3. The vehicle display device according to claim 2, wherein the housing has a discharge port that is an outlet for the liquid that has entered the opening, and the discharging flow path includes a rectification region that is a region between adjacent ones of the protrusions and a terminal end region that is a region disposed in the discharge port and including a terminal end of the discharging flow path.

4. The vehicle display device according to claim 1, wherein in a state where the housing is mounted on the vehicle, the heat dissipation surface is inclined in such a manner that the terminal end of the discharging flow path faces downward with respect to a horizontal plane orthogonal to a vertical direction of the vehicle.

5. The vehicle display device according to claim 2, wherein in a state where the housing is mounted on the vehicle, the heat dissipation surface is inclined in such a manner that the terminal end of the discharging flow path faces downward with respect to a horizontal plane orthogonal to a vertical direction of the vehicle.

6. The vehicle display device according to claim 3, wherein in a state where the housing is mounted on the vehicle, the heat dissipation surface is inclined in such a manner that the terminal end of the discharging flow path faces downward with respect to a horizontal plane orthogonal to a vertical direction of the vehicle.

* * * * *